US010709032B1

(12) United States Patent
Holyoake et al.

(10) Patent No.: US 10,709,032 B1
(45) Date of Patent: Jul. 7, 2020

(54) DATACENTER RACK AND REMOVABLE TRAY

(71) Applicant: International Business Machines Corporation, Armonk, NY (US)

(72) Inventors: Colin Ian Holyoake, Braishfield (GB); Barbara Sharon Bishop, Winchester (GB); Graham Jon Eames, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/579,920

(22) Filed: Sep. 24, 2019

(51) Int. Cl.
*H05K 7/14* (2006.01)
*B62B 3/04* (2006.01)
*A47B 57/06* (2006.01)
*A47B 57/58* (2006.01)
*G06F 1/18* (2006.01)

(52) U.S. Cl.
CPC ........... *H05K 7/1488* (2013.01); *A47B 57/06* (2013.01); *A47B 57/585* (2013.01); *B62B 3/04* (2013.01); *G06F 1/183* (2013.01); *B62B 2203/74* (2013.01)

(58) Field of Classification Search
CPC .... H05K 7/1488; H05K 7/1489; A47B 57/58; A47B 57/583; A47B 57/585; A47B 57/586; A47B 13/088; A47B 17/03; A47B 17/036; A47B 17/033; A47B 21/03; A47B 45/00; B62B 2203/74
See application file for complete search history.

(56) References Cited

U.S. PATENT DOCUMENTS

| 9,642,457 | B1 * | 5/2017 | Halfen ............... A47F 7/143 |
| 2003/0107305 | A1 * | 6/2003 | Kusztal ............. A47B 21/03 312/223.3 |
| 2003/0226815 | A1 * | 12/2003 | Gaunt ............... A47B 45/00 211/153 |
| 2009/0129905 | A1 | 5/2009 | McIntosh |
| 2010/0200716 | A1 * | 8/2010 | White, III ......... H05K 7/1489 248/243 |
| 2011/0121696 | A1 * | 5/2011 | Zhou ............... H05K 7/1489 312/223.1 |
| 2012/0145874 | A1 * | 6/2012 | Eberle, Jr. ......... H05K 7/1489 248/636 |
| 2015/0136722 | A1 * | 5/2015 | Chen ............... H05K 7/1489 211/175 |

(Continued)

FOREIGN PATENT DOCUMENTS

| CN | 207957641 U | 10/2018 |
| CN | 208007026 U | 10/2018 |

*Primary Examiner* — Daniel J Rohrhoff
(74) *Attorney, Agent, or Firm* — Alexander G. Jochym

(57) ABSTRACT

A datacenter rack for vertically stacking a plurality of electronic devices is provided. The rack has a frame assembly having two vertical support components and a plurality of removeable trays configured to be inserted between and supported by the vertical support components. Each tray has a pair of opposing sides extending parallel to a longitudinal axis and each of the pair of opposing sides has a tensioned adjustment mechanism to shorten a length of each side to compress the tray in the longitudinal axis, with the tensioned adjustment mechanisms providing a tensioning force against the compression. Each tray also has a top surface with a movement facilitating arrangement for facilitating movement of an electronic device along the tray in the longitudinal axis.

20 Claims, 5 Drawing Sheets

(56) References Cited

U.S. PATENT DOCUMENTS

| | | | | |
|---|---|---|---|---|
| 2016/0165739 A1* | 6/2016 | Li | ....................... | H05K 7/1489 |
| | | | | 361/679.58 |
| 2017/0156489 A1* | 6/2017 | Tippmann | .............. | A47B 17/04 |
| 2018/0050862 A1 | 2/2018 | Wu | | |
| 2019/0298060 A1* | 10/2019 | Chen | ..................... | A47B 88/49 |

* cited by examiner

DATACENTER RACK AND REMOVABLE TRAY

BACKGROUND

The present invention relates to datacenter racks for electronic devices, and more specifically, to a datacenter rack having removable trays for support of electronic devices in the rack.

A datacenter contains racks that physically hold computer equipment in the form of electronic devices such as server type systems or switch type systems. It is part of a datacenter technician's duty to install and remove computer equipment within these racks for hosting. The computer equipment can weigh a considerable amount, anything from 13 kg to approximately 80 kg and can have considerable value.

SUMMARY

According to an aspect of the present invention there is provided a support apparatus for supporting an electronic device in a datacenter rack, comprising: a tray for insertion in a datacenter rack, the tray having a pair of opposing sides extending parallel to a longitudinal axis of the tray, wherein each of the pair of opposing sides has a tensioned adjustment mechanism to shorten a length of each side to compress the tray in the longitudinal axis, and wherein the tensioned adjustment mechanisms provide a tensioning force against the compression; and the tray having a top surface with a movement facilitating arrangement for facilitating movement of an electronic device along the tray in the longitudinal axis.

According to another aspect of the present invention there is provided a datacenter rack for vertically stacking a plurality of electronic devices, comprising: a frame assembly having two vertical support components; and a plurality of removeable trays configured to be inserted between and supported by the vertical support components, wherein a tray includes: a pair of opposing sides extending parallel to a longitudinal axis of the tray, wherein each of the pair of opposing sides has a tensioned adjustment mechanism to shorten a length of each side to compress the tray in the longitudinal axis, and wherein the tensioned adjustment mechanisms provide a tensioning force against the compression; and the tray having a top surface with a movement facilitating arrangement for facilitating movement of an electronic device along the tray in the longitudinal axis.

According to a further aspect of the present invention there is provided a method of housing a plurality of electronic devices in a datacenter rack, comprising: providing a datacenter rack formed of: a frame assembly having two vertical support components; and a plurality of removeable trays configured to be inserted between and supported by the vertical support components; inserting a removeable tray into the frame assembly by engaging first ends of a pair of opposing sides of the tray against one of the vertical support components, applying a compression force to compress the pair of opposing sides against a tensioning force provided by a tensioned adjustment mechanism whilst positioning the tray in the rack, and removing the compression force to allow expansion of the tray between the vertical support components and engagement of second ends of the pair of opposing sides against the other vertical support component.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings.

Preferred embodiments of the present invention will now be described, by way of example only, with reference to the following drawings in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Computer equipment in the form of server type systems may utilize rails that extend 100% out of the rack to allow the computer equipment to sit within locking lugs and to be extended from the rack and returned without issue. However, other types of computer equipment housed in the racks such as switch type system only have small brackets at one end of the rack and are bolted at the other. These do not have support all the way through the rack. Some of these devices are solely bolted at the front or rear of the rack without additional support, placing considerable stress on the front lugs.

As the computer equipment can weigh a considerable amount, they are hard to install due to the lack of rear support. In instances where the computer equipment is held via partial or single sided rails, the technician needs to insert the unit into the rack whilst ensuring the rear of the device slots into these rails without tipping or dropping the unit.

In some instances, it is possible to use manpower at the rear of the rack to guide the unit and take some of the weight. However, there is very limited room to get more than one technician into the rack to support a unit's weight. Some computer equipment requires between 2 and 4 people to lift it and therefore it is not possible to get the manpower internally to the rack. Also, while one technician is securing the front of the device in place, a second technician is supporting the weight and, over time, the fatigue of the second technician's arms will start placing risk on the installation. There is also a risk of over stretching resulting in personal injury Most internal datacenter lifting tools such as stacker trucks or lifting tables do not have the facility to enter the rack to provide support underneath the unit for installation.

Forklifts with extending arms do not have the precision or size to fit internally within a rack safely without snagging cabling or risking other infrastructure. Forklifts are also typically a physical size that will not fit down datacenter rows. They are also not able to rotate within the environment and may not be suitable for internal work due to diesel engines fumes.

In some instances, existing equipment installed within a rack is used to support new equipment being installed. For example, a server may already be located near to the destination of a switch and the server may take the main weight of the switch whilst rack preparation is performed. This is not recommended as it places strain on the supports of the existing server.

Figure 1:
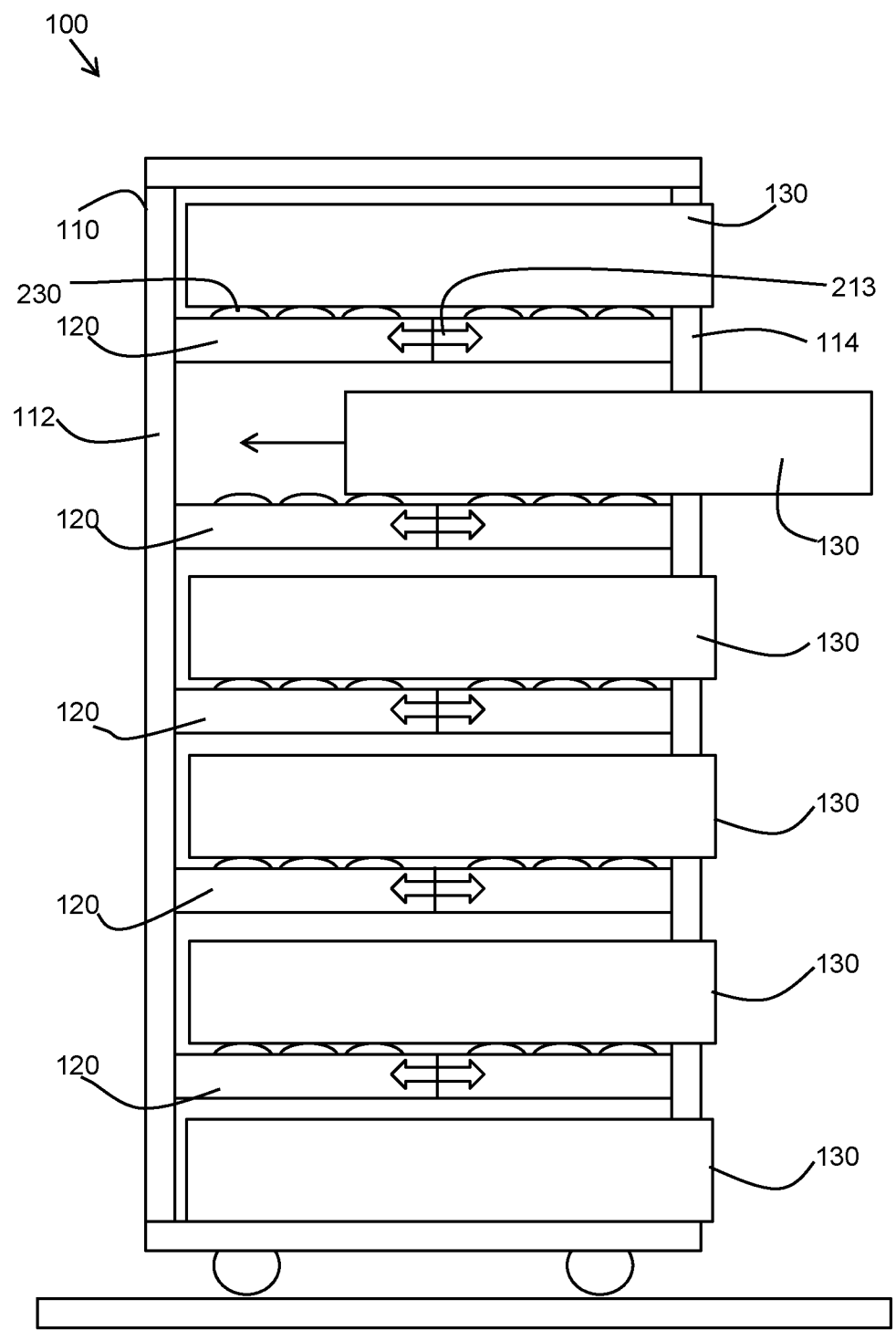
FIG. 1 is a side view of an example embodiment of a datacenter rack, in accordance with an embodiment of the invention.

Referring to FIG. 1, an example embodiment of a datacenter rack 100 is shown for vertically stacking a plurality of electronic devices 130, such as server systems, switch systems, or other information technology (IT) equipment. The electronic devices 130 are supported in the rack 100 with the electronic devices 130 inserted back first into the rack 100 with fronts of the electronic devices 130 exposed for access.

The rack 100 is formed of a frame assembly 110 having two vertical support components 112, 114 in the form of front and rear open frames in a fixed mutual relationship forming the frame assembly 110. The vertical support component 114 at a front of the rack 100 may be formed of parallel vertical supports having one or more openings between them for display and access to the fronts of the electronic devices 130.

The described rack 100 has a plurality of removeable, compressible and expandable trays 120 configured to be inserted between and supported by the vertical support components 112, 114.

The vertical support components 112, 114 have regularly, vertically spaced receiving elements (not shown) for engaging with engagement elements of the trays 120. The receiving elements of the vertical support components 112, 114 face each other in an opposed relationship between which a tray 120 is inserted.

The trays 120 are configured to be easily insertable into a rack 100 by longitudinal compression of a tray 120 whilst being inserted between the vertical support components 112, 114 of the rack 100, with the tray 120 being expandable when in an inserted position. When in the inserted position between the vertical support components 112, 114 of the rack 100, the tray 120 is still partially compressed so that a force is exerted on the vertical support components 112, 114 keeping the tray 120 in place in the rack 100. This is achieved by having tensioned adjustment mechanisms 213 in sides of the tray 120.

Each tray 120 also has a top surface with a movement facilitating arrangement, such as rollers 230 for facilitating movement of an electronic device 130 along the tray 120. In this way, the tray 120 can be positioned at a selected height in the rack 100 and can support and facilitate movement of the electronic device 130 as it is inserted along the tray 120 into the rack 100.

Figure 2A:
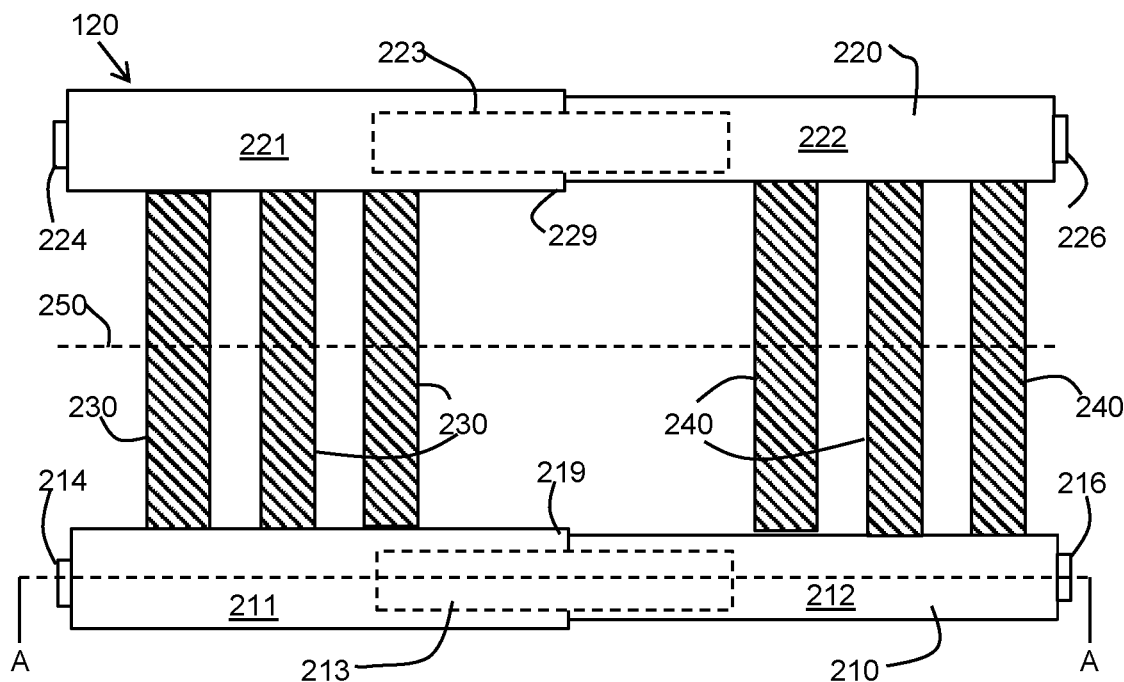
FIG. 2A is a plan view of an example embodiment of a tray for a datacenter rack, in accordance with an embodiment of the invention.
Figure 2B:
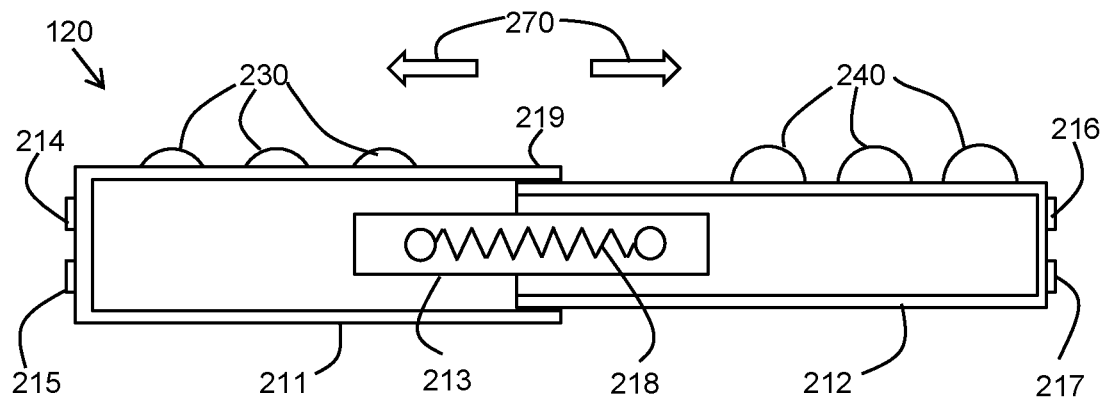
FIG. 2B is a cross-sectional view through line A-A of the tray of FIG. 2A, in accordance with an embodiment of the invention.

Referring to FIGS. 2A and 2B, an example embodiment of a tray 120 is shown. FIG. 2A shows a tray 120 in plan view and FIG. 2B shows a cross-sectional view of the tray 120 through line A-A of FIG. 2A.

FIG. 2A shows the tray 120 with a pair of opposing sides 210, 220 extending parallel to a longitudinal axis 250 of the tray 120. The longitudinal axis 250 is an axis of the tray 120 in the direction that the tray 120 is compressible. Each of the pair of opposing sides 210, 220 has a tensioned adjustment mechanism 213, 223 to shorten a length of each side 210, 220 to compress the tray 120, with the tensioned adjustment mechanisms 213, 223 providing a tensioning force 270 against the compression.

Each side 210, 220 of the tray 120 is formed of two or more slidable members, 211, 212, 221, 222 in a telescoping arrangement with an overlapping portion 219, 229 with the tensioned adjustment mechanism 213, 223 acting between the two or more slidable members 211, 212, 221, 222. The tensioned adjustment mechanisms 213, 223 include a spring tensioning mechanism 218 with a rest position in which the overlapping portions 219, 229 are mutually extended.

Trays 120 may be provided so that, in a rest position, the opposing sides 210, 220 each have a length greater than a distance between the two vertical support components 112, 114 of a rack 100 in which the tray 120 is to be supported. This ensures that when a tray 120 is inserted into a rack 100 between the rack's vertical support components 112, 114, the tray is still in a partially compressed configurations so that a tensioning force is exerted to push the tray 120 against each of the vertical support components 112, 114 and hold the tray 120 securely in place in the rack 100. Various different sizes of tray 120 may be provided for use with different sizes of rack 100. A single size of tray 120 may also have varying degrees of compression to fit within different sizes of rack 100.

Each of the pair of opposing sides 210, 220 includes one or more engagement elements 214, 215, 216, 217, 224, 226, at each end for engagement with one of a plurality of receiving elements in the vertical support components 112, 114 allowing positioning of the plurality of trays 120 in a variable arrangement in the rack. In the illustrated embodiment, two engagement elements 214, 215, 216, 217 are provided at each end of a tray 120 in the form of vertically adjacent projections for insertion into receiving apertures in a rack 100. The engagement elements 214, 215, 216, 217 may be standard rack lugs that slot through and lock into receiving apertures in the form of "u" holes in the rack 100.

The tray 120 has a top surface with a movement facilitating arrangement for facilitating movement of an electronic device 130 along the tray 120 in the longitudinal axis 250. In the embodiment of FIGS. 2A and 2B, the movement facilitating arrangement is provided by a plurality of rollers 230, 240 disposed transversely between the opposing sides 210, 220 and providing rotating movement in the direction of the longitudinal axis 250 of the tray 120.

The plurality of rollers 230, 240 may include a height adjustment arrangement in the form of supporting roller shafts with elliptical adjustment to vary a height of the rollers 230, 240 in relation to the tray 120. This height adjustment may be useful when finely adjusting a height of a supported electronic device 130 once inserted in a rack 100.

The compression of a tray 120 in the longitudinal axis 250 does not affect the operation of the rollers 230, 240 due to a space provided between sets of rollers attached to the slidable members 211, 212, 221, 222 of the opposing sides 210, 220.

Figure 2C:
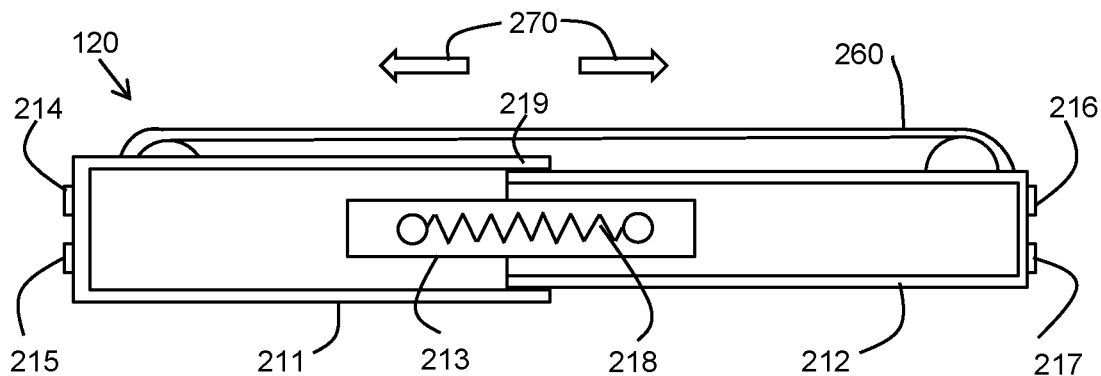
FIG. 2C is a cross-sectional view of another embodiment of a tray, in accordance with an embodiment of the invention.

Referring to FIG. 2C, another embodiment of a tray 120 is shown in which the movement facilitating arrangement is provided by a conveyor belt 260 providing movement in the direction of the longitudinal axis 250. The conveyor belt 260 may have a surface height adjusting mechanism for raising or lowering the conveyor belt 260 in relation to the tray 120.

Figure 3A:
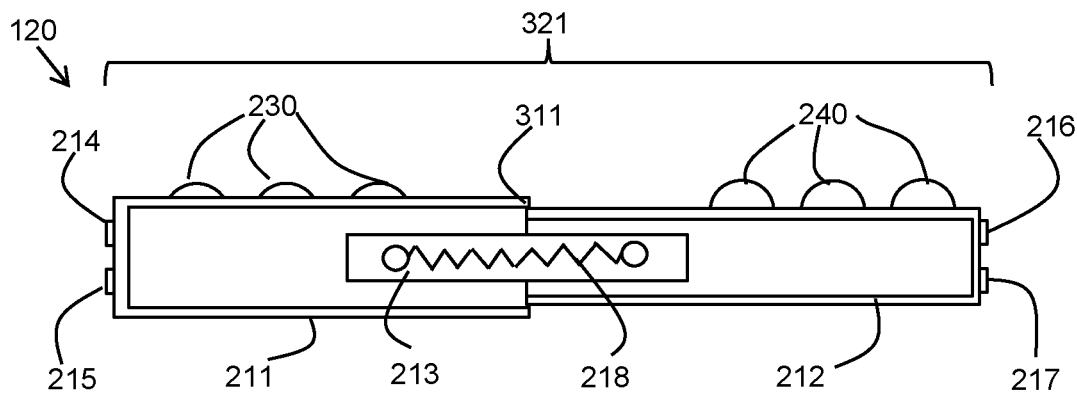
FIG. 3A is a cross-sectional view of the tray of FIG. 2B in an expanded rest position, in accordance with an embodiment of the invention.
Figure 3B:
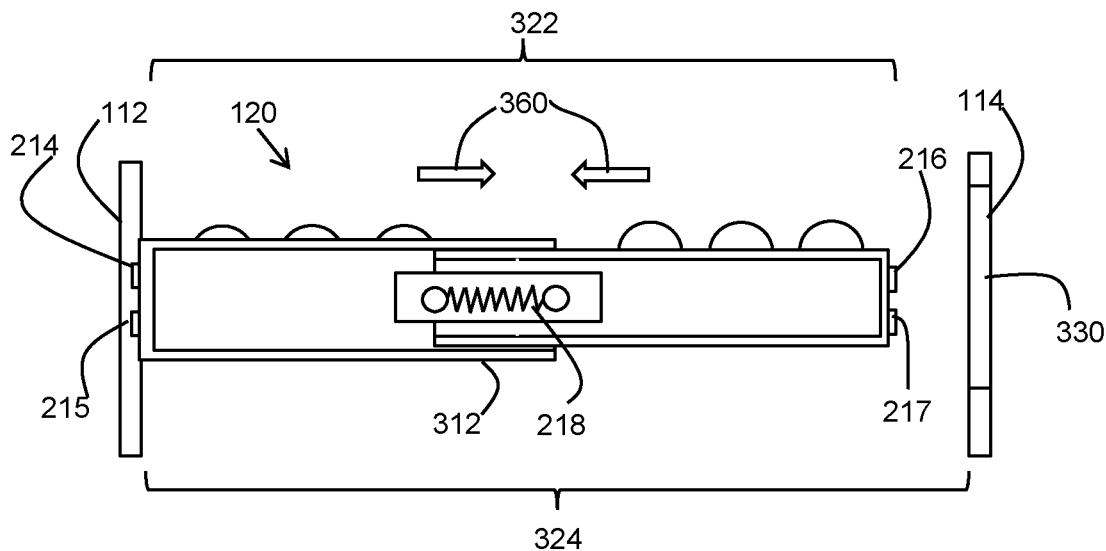
FIG. 3B is a cross-sectional view of the tray of FIG. 2B during assembly in a datacenter rack in a first compressed position, in accordance with an embodiment of the invention.
Figure 3C:
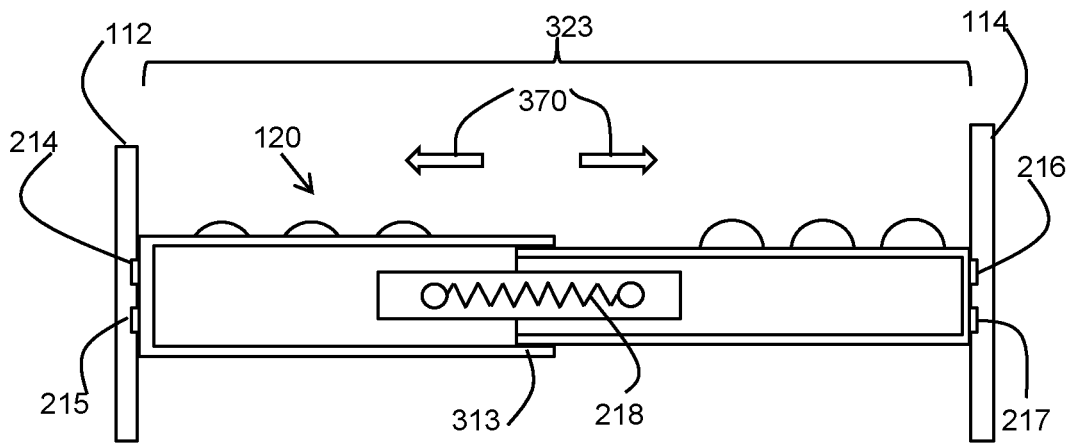
FIG. 3C is a cross-sectional view of the tray of FIG. 2B when assembled in a datacenter rack in a second compressed position, in accordance with an embodiment of the invention.

Referring to FIGS. 3A, 3B and 3C, the example embodiment of a tray 120 described in relation to FIGS. 2A and 2B is shown in three different degrees of expansion and compression to illustrate the installation of a tray 120 in a rack 100 between a front vertical support component 114 and a rear vertical support component 112.

In FIG. 3A, the tray 120 is shown in a rest position in which a spring tensioning mechanism 218 of the tensioned adjustment mechanisms 213 is in an extended position. This results in a minimum overlap 311 between the two slidable members 211, 212. In this position, the tray 120 has a length 321 greater than a distance 324 (shown in FIG. 3B) between the front vertical support component 114 and the rear vertical support component 112 of a rack 100 in which the tray 120 is intended to be inserted.

In FIG. 3B, the tray 120 is shown in a fully compressed position in which a spring tensioning mechanism 218 of the tensioned adjustment mechanisms 213 is in a fully compressed position by exerting a compression force 360. This results in a maximum overlap 312 between the two slidable members 211, 212. In this position, the tray 120 has a length 322 smaller than a distance 324 between the front vertical support component 114 and the rear vertical support component 112 of a rack 100 in which the tray 120 is intended to be inserted.

The tray 120 is inserted in a rack 100 by inserting the tray through an opening 330 in the front vertical support component 114. The tray may need to be tilted diagonally from the horizontal through the opening 330. The tray 120 is engaged against the rear vertical support components 112 with the engagement elements 214, 215 cooperating with receiving elements of the rear vertical support component 112 and a compression force 360 is applied to the pair of opposing sides 210, 220 of the tray 120 against the tensioning force whilst positioning the tray 120 in the rack 100. The tray 120 is compressed to a length 322 less than the distance 324 between the front vertical support component 114 and the rear vertical support component 112 of a rack 100.

As shown in FIG. 3C, removing the compression force allows expansion of the tray 120 between the vertical support components 112, 114 and engagement of the engagement elements 216, 217 of the front of the tray 120 to engage with receiving elements in the front vertical support component 114 on either side of the opening 330. In this position, the tray 120 has a length 324 equal to a distance 324 between the front vertical support component 114 and the rear vertical support component 112 of a rack 100 in which the tray 120 is intended to be inserted.

In FIG. 3C, the tray 120 is shown in a partially compressed position in which a spring tensioning mechanism 218 of the tensioned adjustment mechanisms 213 is in a partially compressed position. This results in a medium overlap 313 between the two slidable members 211, 212. A tray 120 may be installed in different sizes of rack 100 by having different partially compressed positions.

Partial remaining compression of the spring tensioning mechanism 218 of the tensioned adjustment mechanisms 213 allows a remaining tensioning force 370 to be exerted on the insides of the front and rear vertical support components 114, 112 pushing the engagement elements 214, 215, 216, 217 against the front and rear vertical support components 114, 112 and holding the tray 120 in engagement with the rack 100.

The tensioning adjustment mechanism 213, 223 ensures the tray is pushing out into the rack supports and thus remains in place with tension to support the weight of an electronic device 130. Removal of the device simply requires a person to physically push against the tray 120 the rear vertical support component to shrink the tray smaller than the rack.

The compressible design of the tray 120 allows the engagement elements 214, 215, 216, 217 to be removed from the rack for easy removal and storage of the tray 120.

Once installed the tray 120 provides a level platform over which to roll the electronic device 130 to be installed.

Figure 4A:
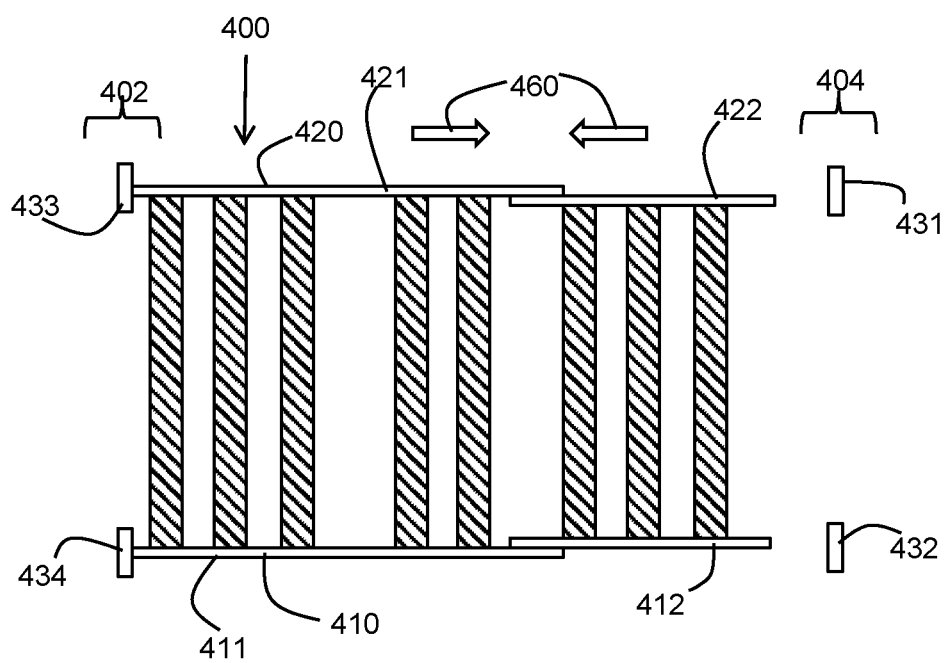
FIG. 4A is a plan view of another example embodiment of a tray a first compressed position during assembly in a datacenter rack, in accordance with an embodiment of the invention.
Figure 4B:
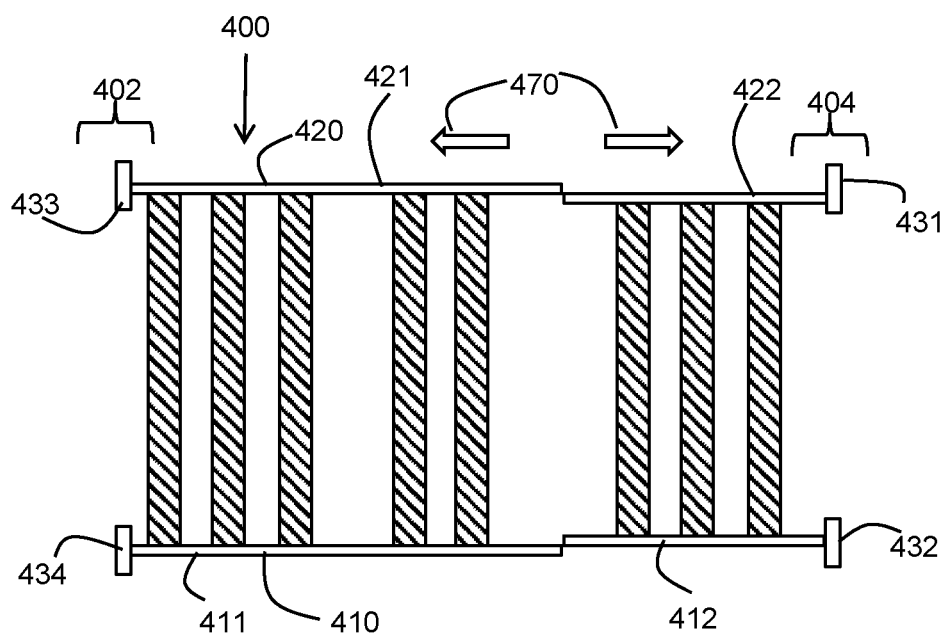
FIG. 4B is a plan view of the tray of FIG. 4A a second compressed position assembled in a datacenter rack, in accordance with an embodiment of the invention.

FIGS. 4A and 4B show plan views of another embodiment of a tray 400. In this embodiment, a front vertical support component 404 is shown as a pair of vertical supports 431, 432 that engage with the ends of the opposing sides 410, 420 of the tray 400 and a rear vertical support component 402 is shown as a pair of vertical supports 433, 434 that engage with the other ends of the opposing sides 410, 420 of the tray 400. The vertical supports 431, 432, 433, 434 may have regularly spaced apertures for receiving protrusions extending from the ends of the opposing sides 410, 420.

In the embodiment of the tray 400 of FIGS. 4A and 4B, the opposing sides 410, 420 are shows with two slidable members 411, 412, 421, 422 that overlap as an alternative to the telescoping arrangement of the previous embodiments.

FIG. 4A shows the tray 400 in a fully compressed 460 position during insertion between the rear and front vertical support components 412, 414. FIG. 4B shows the tray 400 installed between the rear and front vertical support components 402, 404 and exerting a tensioning force 470 on the rear and front vertical support components 402, 404.

Figure 5A:
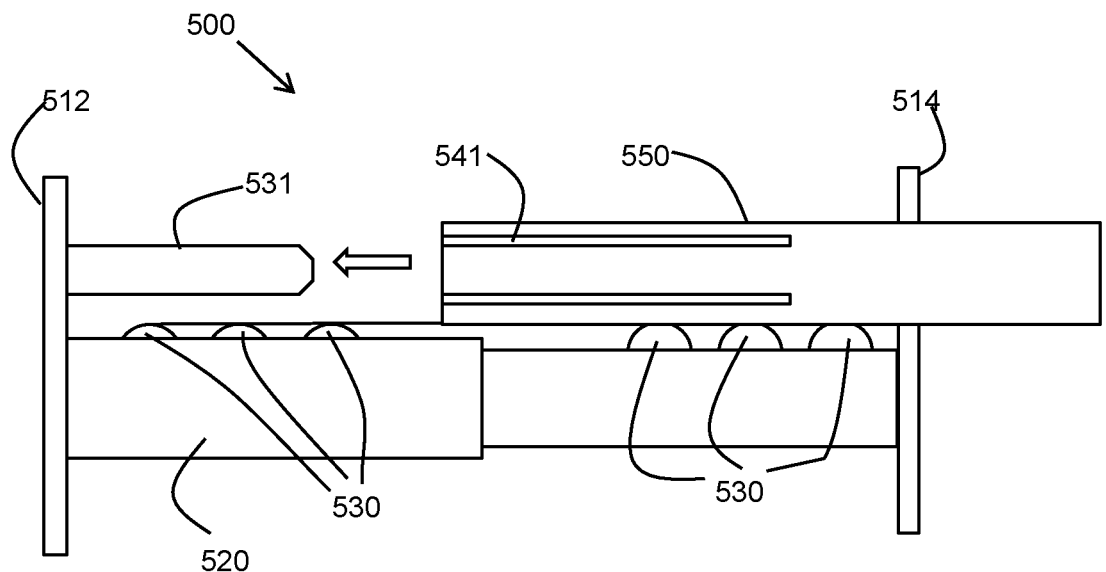
FIG. 5A is a side view of another example embodiment of a tray assembly in a datacenter rack illustrating the installation of an electronic device on the tray, in accordance with an embodiment of the invention.

Referring to FIG. 5A, an example embodiment is shown of a rack 500 with a tray 520 inserted between front and rear support components 512, 514 of a rack. In this embodiment, the rear vertical support component 512 includes a pair of half-length rails 531 extending from the vertical support component 512 to engage receiving rails 541 of an electronic device 550 as it is inserted into the rack by being rolled over the rollers 530 and supported by the tray 520.

FIG. 5A illustrates utilizing both half-length rails 531 at the rear to support the electronic device's weight and the extendable tensioned tray 520, which ensures the tray 520 is pushed out into the rack supports and thus remains in place with tension to support the weight of the electronic device 550.

Figure 5B:
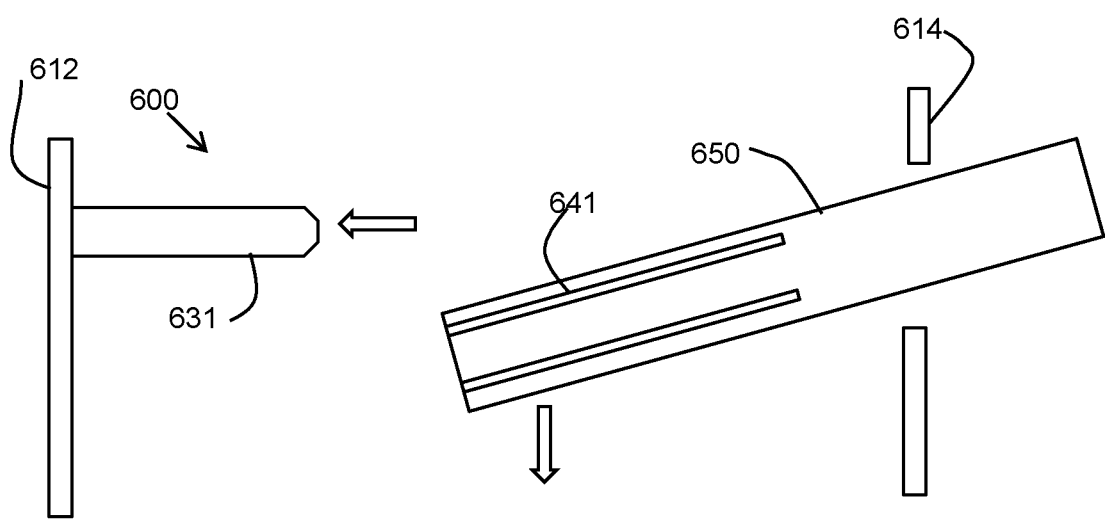
FIG. 5B is a side view of a prior art installation of an electronic device in a datacenter rack, in accordance with an embodiment of the invention.

FIG. 5B shows a prior art rack 600 in which there is no support provided for the electronic device 650 whilst it is being inserted in the rack 600. In this embodiment, a rear vertical support component 612 includes a pair of half-length rails 631 extending from the vertical support component 612 to engage receiving rails 641 of an electronic device 650 as it is inserted into the rack 600 through the front vertical support component 614. However, due to the short length of the half-length pair of rails 631 there is a risk that the electronic device 650 may tilt and fall as there is no support in this semi-installed position.

As an example, electronic devices in the form of network switches are often supported by single sided racking as they are solely bolted from the front of a rack or they may use small brackets or half-length rails at the rear to support the electronic device's weight. As the installer performs the installation, the installer may slide the device from the front of the rack with the intention to sit and lock the device into these rear brackets. If the installer fails to do this, or has no additional support there is a risk of the equipment falling or personal injury. If the rack is unpopulated with devices, existing hardware underneath an installation position cannot be used to support the new device.

The described rack and tray provide a rack with a spring-loaded support shelf to support the installation of electronic devices. The described arrangement provides a quick fit, shrink and extend, adjustable platform to securely fix between the front and back of a datacenter rack underneath the proposed installation position of an electronic device.

The described tray allows an electronic device to securely sit within rails of a datacenter equipment rack and mitigates the risk of the equipment falling. Embedding a smooth roller system or conveyer belt in the top surface of the tray ensures minimal impact to the electronic device being installed and allows a single operator to slide the device into the rack without any risk of falling.

The front to back direction of installation allows the hardware to be easily aligned to any existing rails without any additional strain.

The described rack may be based on the 19" rack format and does not interfere with rear cabling of the supported electronic devices.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Improvements and modifications can be made to the foregoing without departing from the scope of the present invention.

What is claimed is:

1. A support apparatus for supporting an electronic device in a datacenter rack, comprising:
    a tray for insertion in a datacenter rack, the tray having a pair of opposing sides extending parallel to a longitudinal axis of the tray, wherein each of the pair of opposing sides has a tensioned adjustment mechanism to shorten a length of each side to compress the tray in the longitudinal axis, and wherein the tensioned adjustment mechanisms provide a tensioning force against the compression; and
    the tray having a top surface with a movement facilitating arrangement for facilitating movement of an electronic device along the tray in the longitudinal axis.

2. The apparatus as claimed in claim 1, wherein each of the pair of opposing sides includes one or more engagement elements at each end for engagement with a portion of the datacenter rack.

3. The apparatus as claimed in claim 1, wherein each of the pair of opposing sides is formed of two slidable members with overlapping portions and the tensioned adjustment mechanism includes a spring tensioning mechanism with a rest position in which the overlapping portions are mutually extended.

4. The apparatus as claimed in claim 1, wherein the movement facilitating arrangement is provided by a plurality of rollers providing movement in the direction of the longitudinal axis of the tray.

5. The apparatus as claimed in claim 4, wherein the plurality of rollers include a height adjustment arrangement in the form of supporting roller shafts with elliptical adjustment to vary a height of the plurality of rollers in relation to the tray.

6. The apparatus as claimed in claim 1, wherein the movement facilitating arrangement is provided by a conveyor belt providing movement in the direction of the longitudinal axis.

7. The apparatus as claimed in claim 6, wherein the conveyor belt has a surface height adjusting mechanism for raising or lowering the conveyor belt in relation to the tray.

8. A datacenter rack for vertically stacking a plurality of electronic devices, comprising:
    a frame assembly having two vertical support components; and
    a plurality of removeable trays configured to be inserted between and supported by the vertical support components, wherein a tray includes:
        a pair of opposing sides extending parallel to a longitudinal axis of the tray, wherein each of the pair of opposing sides has a tensioned adjustment mechanism to shorten a length of each side to compress the tray in the longitudinal axis, and wherein the tensioned adjustment mechanisms provide a tensioning force against the compression; and
        the tray having a top surface with a movement facilitating arrangement for facilitating movement of an electronic device along the tray in the longitudinal axis.

9. The datacenter rack as claimed in claim 8, wherein each of the pair of opposing sides includes one or more engagement elements at each end for engagement with one of a plurality of receiving elements in the vertical support components allowing positioning of the plurality of trays in a variable arrangement in the rack.

10. The datacenter rack as claimed in claim 8, wherein the two vertical support components are front and rear open frames in a fixed mutual relationship forming the frame assembly and wherein the front and rear open frames have regularly spaced receiving elements along vertical members with the receiving elements of the front open frame facing the receiving elements of the rear open frame.

11. The datacenter rack as claimed in claim 8, wherein the tray is configured to be inserted by engaging the tray against one of the vertical support components, applying a compression force to the pair of opposing sides against the tensioning force whilst positioning the tray in the rack, and removing the compression force allowing expansion of the tray between the vertical support components.

12. The datacenter rack as claimed in claim 8, wherein a tray of the plurality of removable trays has a length of each of the pair of opposing sides such that each of the sides is partially compressed against the tensioning force when inserted between the two vertical support components thereby providing the tensioning force against the vertical support components.

13. The datacenter rack as claimed in claim 8, wherein each of the pair of opposing sides of a tray is formed of two slidable members with overlapping portions and the tensioned adjustment mechanism includes a spring tensioning mechanism with a rest position in which the overlapping portions are mutually extended with a length greater than a distance between the two vertical support components.

14. The datacenter rack as claimed in claim 8, wherein the movement facilitating arrangement is provided by a plurality of rollers providing movement in the direction of the longitudinal axis of the tray.

15. The datacenter rack as claimed in claim 14, wherein the plurality of rollers include a height adjustment arrangement in the form of supporting roller shafts with elliptical adjustment to vary a height of the plurality of rollers in relation to the tray.

16. The datacenter rack as claimed in claim 8, wherein the movement facilitating arrangement is provided by a conveyor belt providing movement in the direction of the longitudinal axis with a surface height adjusting mechanism for raising or lowering the conveyor belt in relation to the tray.

17. A method of housing a plurality of electronic devices in a datacenter rack, comprising:
providing a datacenter rack formed of:
   a frame assembly having two vertical support components; and
   a plurality of removeable trays configured to be inserted between and supported by the vertical support components;
inserting a removeable tray into the frame assembly by engaging first ends of a pair of opposing sides of the tray against one of the vertical support components, applying a compression force to compress the pair of opposing sides against a tensioning force provided by a tensioned adjustment mechanism whilst positioning the removable tray in the rack, and removing the compression force to allow expansion of the tray between the vertical support components and engagement of second ends of the pair of opposing sides against the other vertical support component.

18. The method as claimed in claim 17, including engaging the first ends of the pair of opposing sides with receiving elements provided at a selected position on the vertical support components.

19. The method as claimed in claim 17, including facilitating movement of an electronic device along a tray for insertion of the electronic device in the rack by providing a movement facilitating arrangement on a top surface of a tray.

20. The method as claimed in claim 19, including adjusting a height of the movement facilitating arrangement on the top surface of a tray.

\* \* \* \* \*